US007795066B2

(12) United States Patent
Tsai et al.

(10) Patent No.: US 7,795,066 B2
(45) Date of Patent: Sep. 14, 2010

(54) METHOD FOR MAKING CAMERA MODULES AND CAMERA MODULE MADE THEREBY

(75) Inventors: Chia-Hsi Tsai, Taipei (TW); Cheng-Te Tseng, Taipei (TW); Tzu-Kan Chen, Taipei (TW); Yi-Ting Lin, Taipei (TW)

(73) Assignees: Silitek Electronic (Guangzhou) Co., Ltd., Guangzhou (CN); Lite-On Technology, Taipei (TW)

( * ) Notice: Subject to any disclaimer, the term of this patent is extended or adjusted under 35 U.S.C. 154(b) by 0 days.

(21) Appl. No.: 12/292,184

(22) Filed: Nov. 13, 2008

(65) Prior Publication Data
US 2010/0006966 A1    Jan. 14, 2010

(30) Foreign Application Priority Data
Jul. 10, 2008    (CN) .................. 2008 1 0029455

(51) Int. Cl.
*H01L 21/00* (2006.01)
*H01L 21/44* (2006.01)
*H01L 21/48* (2006.01)
*H01L 21/50* (2006.01)

(52) U.S. Cl. .................. 438/65; 438/69; 438/126
(58) Field of Classification Search .......... 438/65, 438/69, 126; 257/E31.127
See application file for complete search history.

(56) References Cited

U.S. PATENT DOCUMENTS

| 7,457,490 | B2 * | 11/2008 | Rudmann et al. | 385/14 |
| 7,521,335 | B2 * | 4/2009 | Yamanaka | 438/458 |
| 2003/0116886 | A1 * | 6/2003 | Nakazawa | 264/255 |
| 2004/0184737 | A1 * | 9/2004 | Oono et al. | 385/52 |

FOREIGN PATENT DOCUMENTS

TW    M314431    6/2007

* cited by examiner

*Primary Examiner*—William M. Brewster
(74) *Attorney, Agent, or Firm*—Rosenberg, Klein & Lee

(57) ABSTRACT

A method for making lens modules includes the steps of: a) providing a wafer including an array of sensor chips; b) mounting a plurality of lens assemblies on the sensor chips, respectively, thereby defining a plurality of intersecting spacing grooves among the lens assemblies; c) forming substrate layer by filling in the spacing grooves with a resin material; and d) cutting the wafer and the substrate layer along intersecting cutting lines each extending along one of the spacing grooves and each intervening the lens assemblies, the substrate layer being divided into a plurality of barrels respectively surrounding the lens assemblies. A lens module made by the method is also disclosed.

4 Claims, 15 Drawing Sheets

METHOD FOR MAKING CAMERA MODULES AND CAMERA MODULE MADE THEREBY

CROSS-REFERENCE TO RELATED APPLICATION

This application claims priority of Chinese Application No. 200810029455.0, filed on Jul. 10, 2008.

BACKGROUND OF THE INVENTION

1. Field of the Invention

The invention relates to a method for making lens modules, more particularly to a method for making lens modules in a manner of wafer level packaging. The invention also relates to a lens module made by the method.

2. Description of the Related Art

Referring to FIG. 1, Taiwanese Utility Model No. M314431 discloses a lens module 1 including a substrate 11, a sensor chip assembly 12, and a lens assembly 13. The sensor chip assembly 12 is mounted on the substrate 11, and is electrically connected to the substrate 11 via solder balls 121. The lens assembly 13 covers the sensor chip assembly 12, and includes a barrel 131 and a lens 132.

Conventionally, the aforesaid lens module 1 is made individually. Therefore, the productivity is low and the production cost is relatively high.

SUMMARY OF THE INVENTION

An object of the present invention is to provide a method for making lens modules in a manner of wafer level packaging so that the productivity can be increased and that the production cost and the size of the lens module can be reduced.

Another object of the present invention is to provide a lens module made by the method of this invention.

In the first aspect of this invention, a method for making lens modules includes the steps of: a) providing a wafer including an array of sensor chips; b) mounting a plurality of lens assemblies on the sensor chips, respectively, thereby defining a plurality of intersecting spacing grooves among the lens assemblies; c) forming a substrate layer by filling in the spacing grooves with a resin material; and d) cutting the wafer and the substrate layer along intersecting cutting lines each extending along one of the spacing grooves and each intervening the lens assemblies, the substrate layer being divided into a plurality of barrels respectively surrounding the lens assemblies.

In the second aspect of this invention, a lens module includes a sensor chip, a lens assembly, and a barrel. The sensor chip has a first surface and a second surface opposite to the first surface. The lens assembly is mounted on the first surface of the sensor chip and has a cross-section smaller than that of the sensor chip so that the first surface of the sensor chip has an excess surface portion around the lens assembly. The barrel is mounted on the excess surface portion of the first surface of the sensor chip and surrounds the lens assembly. The barrel has an outer lateral surface flush with a peripheral end of the sensor chip.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
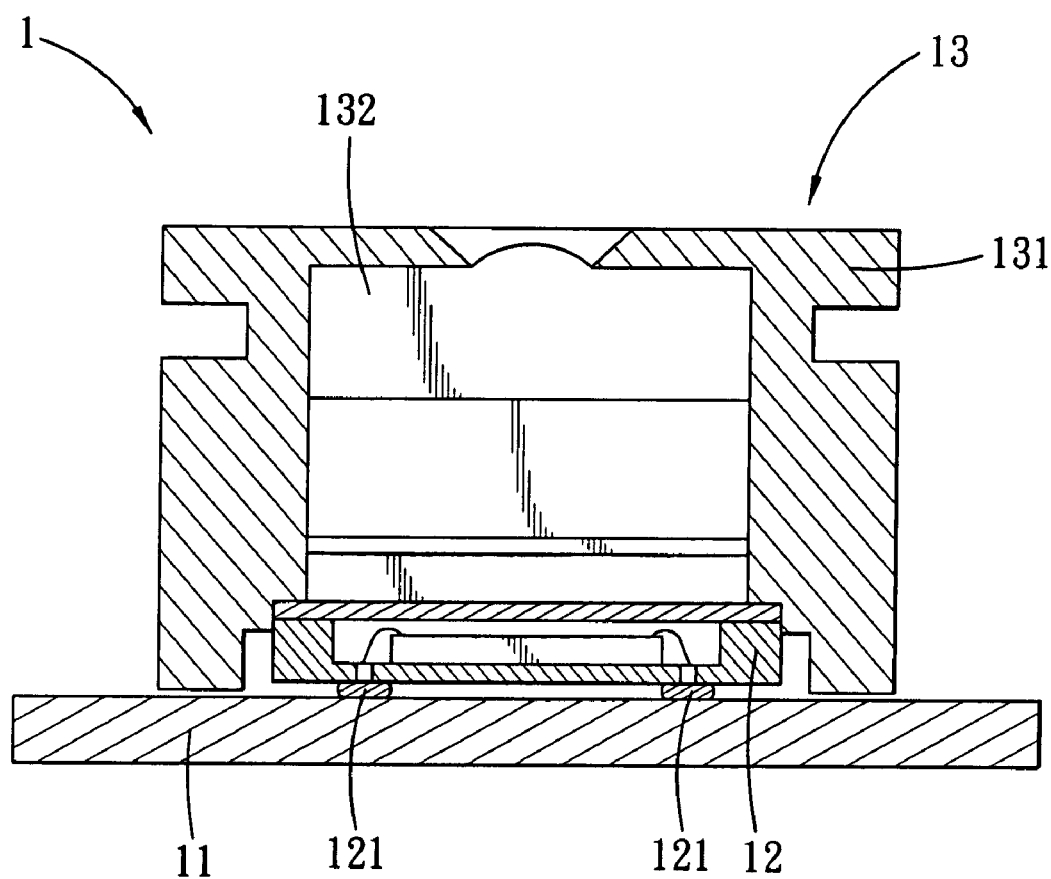
FIG. 1 is a schematic sectional view of a conventional lens module.

Before the present invention is described in greater detail, it should be noted that like elements are denoted by the same reference numerals throughout the disclosure.

Figure 2A:
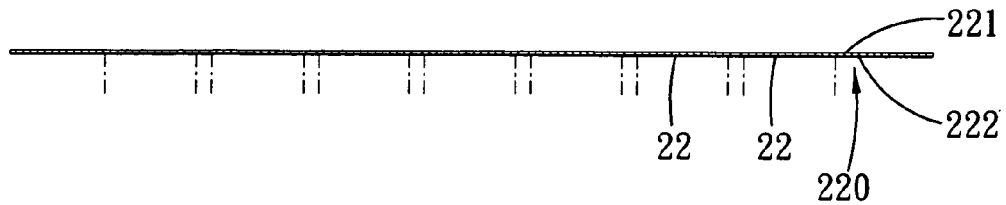
FIGS. 2A to 2G are schematic views illustrating consecutive steps of a first preferred embodiment of a method for making lens modules according to this invention.

Referring to FIGS. 2A to 2G, the first preferred embodiment of a method for making lens modules according to this invention includes the steps of:

A) providing a wafer:

Referring to FIG. 2A, a wafer 220 is provided, which includes an array of sensor chips 22, and has a first surface 221 and a second surface 222 opposite to the first surface 221.

Figure 2B:
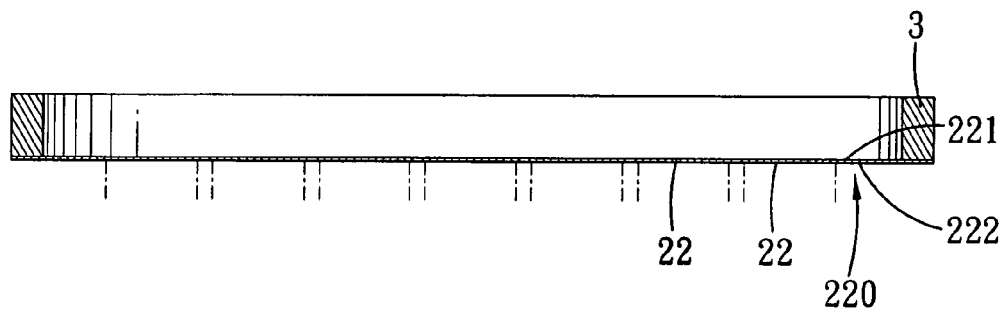

B) mounting a surrounding wall:

Referring to FIG. 2B, a surrounding wall 3 is mounted on the first surface 221 of the wafer 220. The surrounding wall 3 extends along the periphery of the wafer 220. In the preferred embodiment, the surrounding wall 3 is connected to the first surface 221 of the wafer 220 in a gluing manner.

Figure 2C:
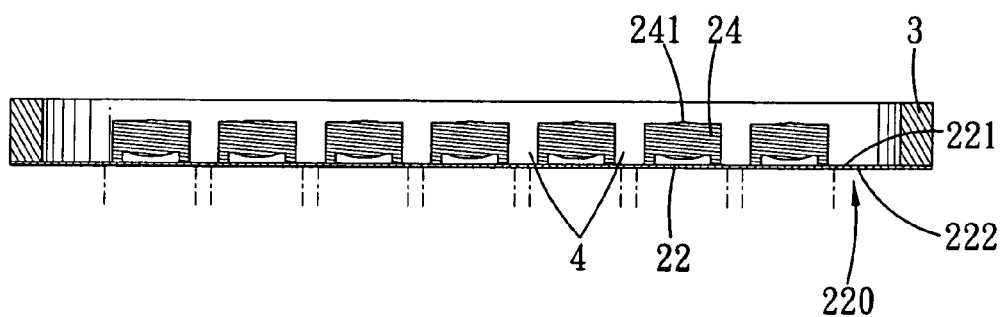

C) mounting a plurality of lens assemblies:

Referring to FIG. 2C, a plurality of lens assemblies 24 are simultaneously mounted on the sensor chips 22, respectively, using an automatic equipment (not shown), thereby defining a plurality of intersecting spacing grooves 4 among the lens assemblies 24. The lens assemblies 24 and the spacing grooves 4 are surrounded by the surrounding wall 3. The lens assemblies 24 are fixed on the first surface 221 of the wafer 220 in a gluing manner. Each of the lens assemblies 24 has a light-transmissive portion 241 on top thereof.

Figure 2D:
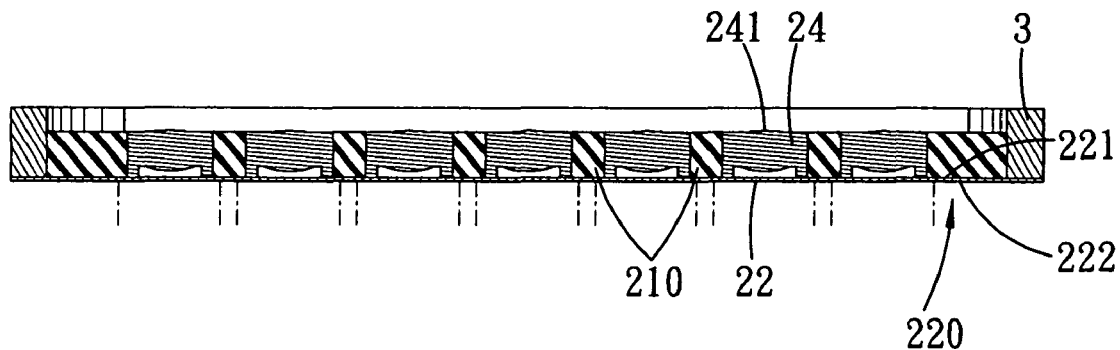

D) filling a resin material:

Referring to FIG. 2D, a resin material is filled into the surrounding wall 3 and the spacing grooves 4 to form a substrate layer 210. In the preferred embodiment, the substrate layer 210 is substantially flush with the lens assemblies 24 so as to prevent the light-transmissive portion 241 of each of the lens assemblies 24 from being covered with the resin material. The resin material is preferably filled into the surrounding wall 3 and the spacing grooves 4 at a plurality of filling spots so as to shorten the filling period.

Figure 2E:
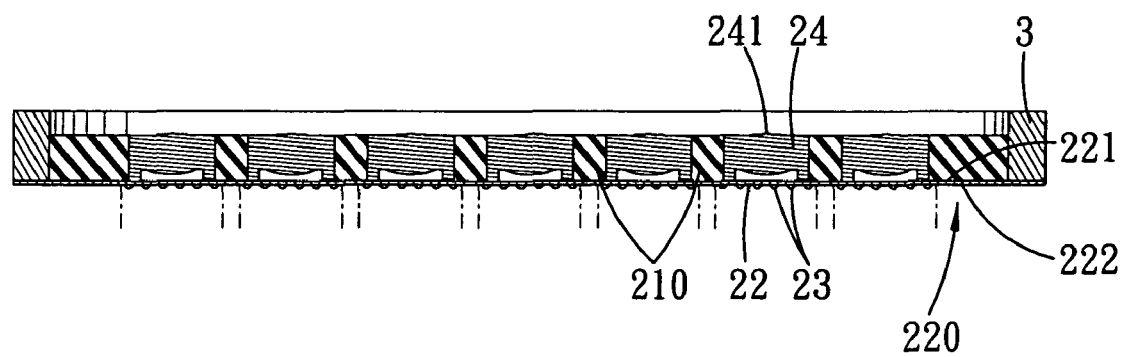

E) mounting a plurality of conductive blocks:

Referring to FIG. 2E, a plurality of conductive blocks 23 are mounted on bonding pads (not shown) on the second surface 222 of the wafer 220 using a surface mounting technology after the resin material is solidified. In the preferred embodiment, the conductive blocks 23 are solder balls. Alternatively, the conductive blocks 23 can be conductive bumps.

Figure 2F:
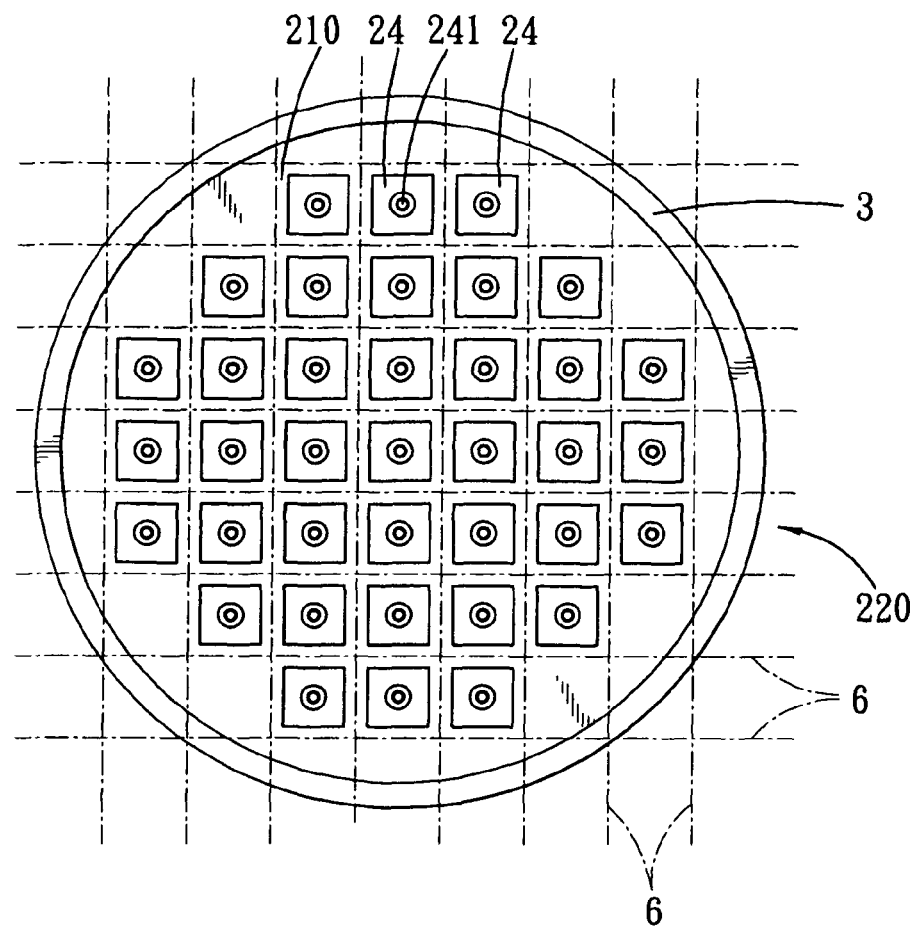

F) cutting the wafer and the substrate layer:

Referring to FIG. 2F, the wafer 220 and the substrate layer 210 are cut along intersecting cutting lines 6 each extending along one of the spacing grooves 4 and each intervening the lens assemblies 24. The substrate layer 210 is divided into a plurality of barrels 21 (best shown in FIG. 2G) respectively surrounding the lens assemblies 24.

Figure 2G:
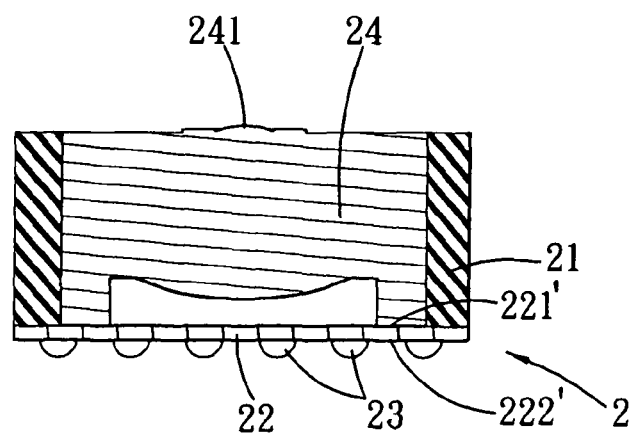

Referring to FIG. 2G, a plurality of lens modules 2 are made simultaneously by the aforesaid method. Each of the lens modules 2 includes the sensor chip 22, the lens assembly 24, the barrel 21, and a plurality of the conductive blocks 23.

The sensor chip 22 has a first surface 221' and a second surface 222' opposite to the first surface 221'. The second surface 222' is provided with a plurality of bonding pads (not shown) thereon.

The lens assembly 24 is mounted on the first surface 221' of the sensor chip 22 and has the light-transmissive portion 241 on top thereof. The lens assembly 24 has a cross-section smaller than that of the sensor chip 22 so that the first surface 221' of the sensor chip 22 has an excess surface portion around the lens assembly 24.

The barrel 21 is mounted on the excess surface portion of the first surface 221' of the sensor chip 22 and surrounds the lens assembly 24. The barrel 21 has an outer lateral surface flush with a peripheral end of the sensor chip 22. The barrel 21 is opaque. In the preferred embodiment, the barrel 21 is made of black epoxy resin.

The conductive blocks 23 are mounted on the second surface 222' of the sensor chip 22. In the preferred embodiment, the conductive blocks 23 are solder balls. Alternatively, the conductive blocks 23 can be conductive bumps.

Referring to FIGS. 3A to 3H, the second preferred embodiment of a method for making lens modules according to this invention is substantially identical to the first preferred embodiment except for the following.

Figure 3A:
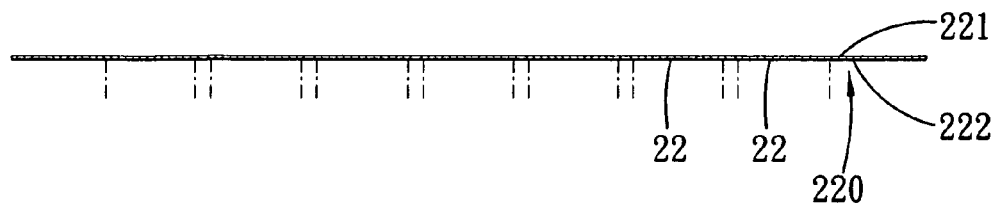
FIGS. 3A to 3H are schematic views illustrating consecutive steps of a second preferred embodiment of a method for making lens modules according to this invention.
Figure 3B:
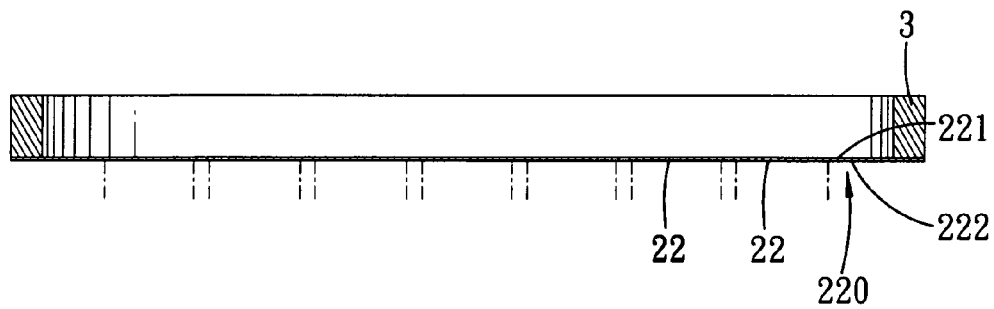
Figure 3C:
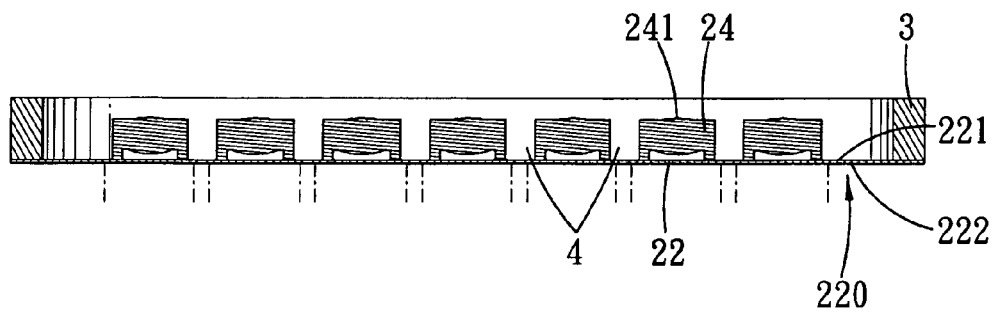
Figure 3D:
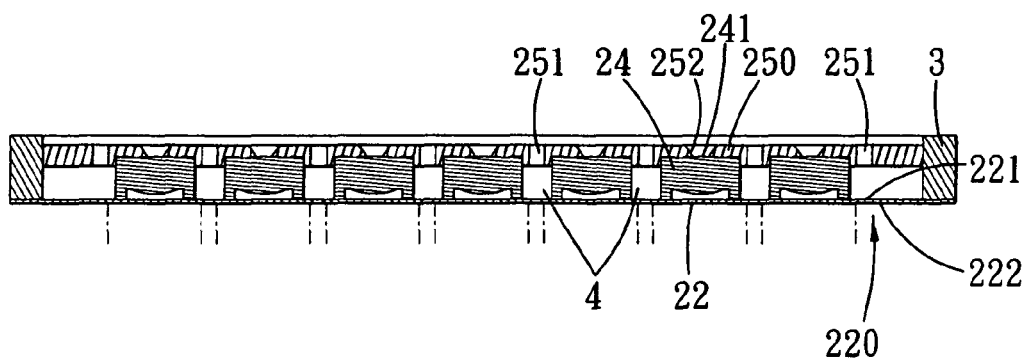

Referring to FIG. 3D, after the lens assemblies 24 are simultaneously mounted on the sensor chips 22, respectively, a cover layer 250 is mounted on the lens assemblies 24. The cover layer 250 is in the form of a thin circular plate having a diameter identical to an inner diameter of the surrounding wall 3. The cover layer 250 includes a plurality of light-transmissive holes 252 corresponding to the light-transmissive portions 241 of the lens assemblies 24, and a plurality of injecting holes 251 spaced apart from each other and communicated with the spacing grooves 4.

Figure 3E:
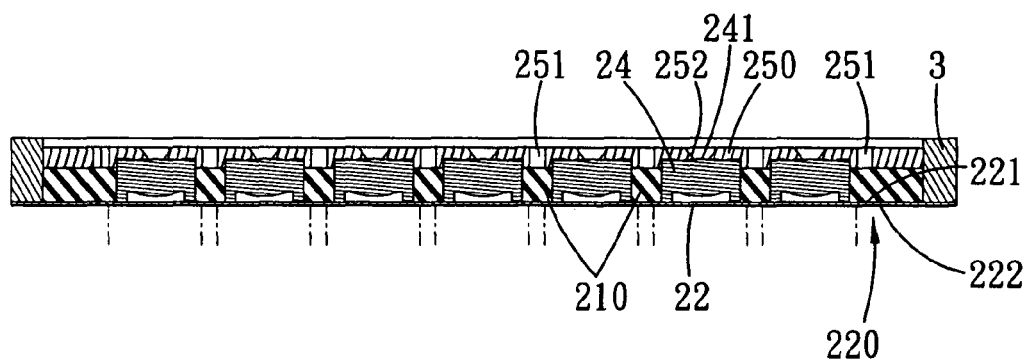
Figure 3F:
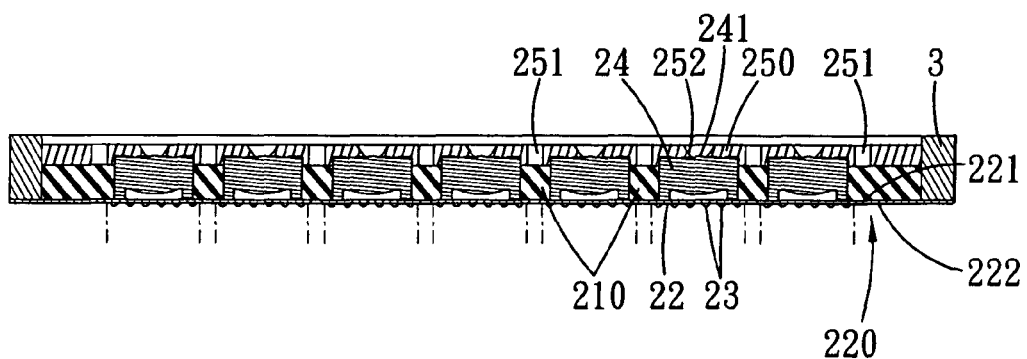
Figure 3G:
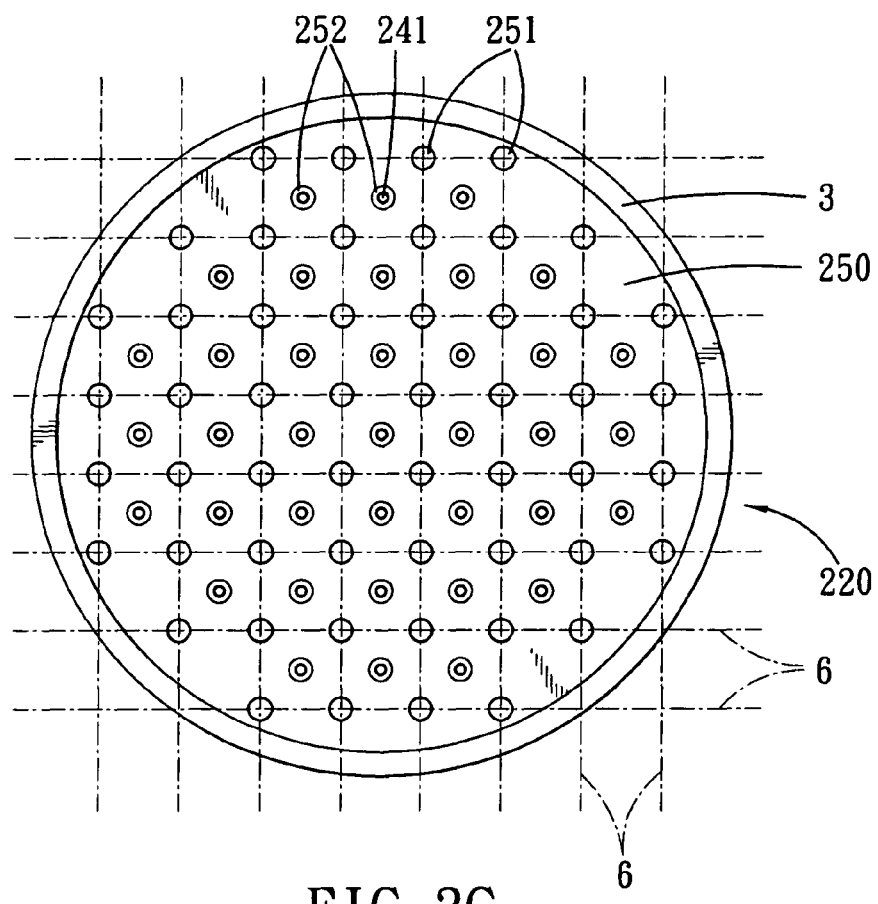

Referring to FIG. 3E, after the cover layer 250 is mounted on the lens assemblies 24, the resin material is filled into the surrounding wall 3 and the spacing grooves 4 via the injecting holes 251 of the cover layer 250 to form the substrate layer 210. In the preferred embodiment, the substrate layer 210 has a thickness so that the top surface of the substrate layer 210 is substantially flush with the bottom surface of the cover layer 250.

Figure 3H:
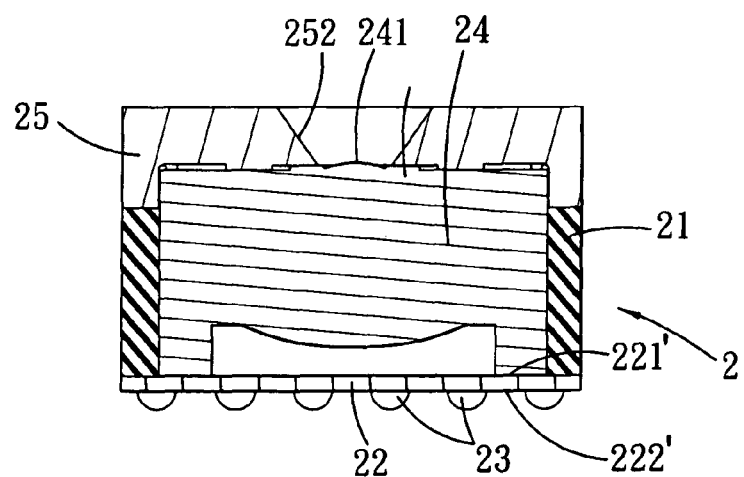

Referring to FIG. 3H, each of the lens modules 2 made by the second preferred embodiment is substantially similar to each of the lens modules 2 made by the first preferred embodiment except that each of the lens modules 2 made by the second preferred embodiment includes a cover 25. The cover 25 is mounted on the barrel 21 and the lens assembly 24, and has a light-transmissive through hole corresponding to the light-transmissive portion 241 of the lens assembly 24. The cover 25 has an outer lateral surrounding surface substantially flush with the outer lateral surface of the barrel 21 and with the peripheral end of the sensor chip 22. The barrel 21 is mounted between the cover 25 and the sensor chip 22.

Figure 4A:
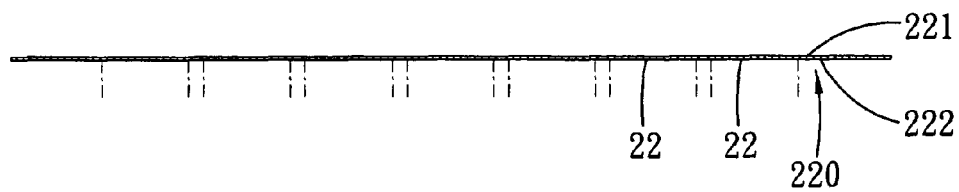
FIGS. 4A to 4I are schematic views illustrating consecutive steps of a third preferred embodiment of a method for making lens modules according to this invention.

Referring to FIGS. 4A to 4I, the third preferred embodiment of a method for making lens modules according to this invention includes the steps of:

I) providing a wafer:

Referring to FIG. 4A, a wafer 220 is provided, which includes an array of sensor chips 22, and has a first surface 221 and a second surface 222 opposite to the first surface 221.

Figure 4B:
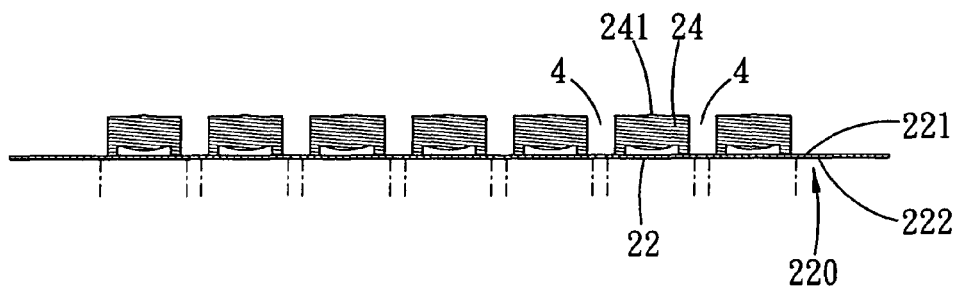

II) mounting a plurality of lens assemblies:

Referring to FIG. 4B, a plurality of lens assemblies 24 are simultaneously mounted on the sensor chips 22, respectively, using an automatic equipment (not shown), thereby defining a plurality of intersecting spacing grooves 4 between the lens assemblies 24. The lens assemblies 24 are fixed on the first surface 221 of the wafer 220 in a gluing manner. Each of the lens assemblies 24 has a light-transmissive portion 241 on top thereof.

Figure 4C:
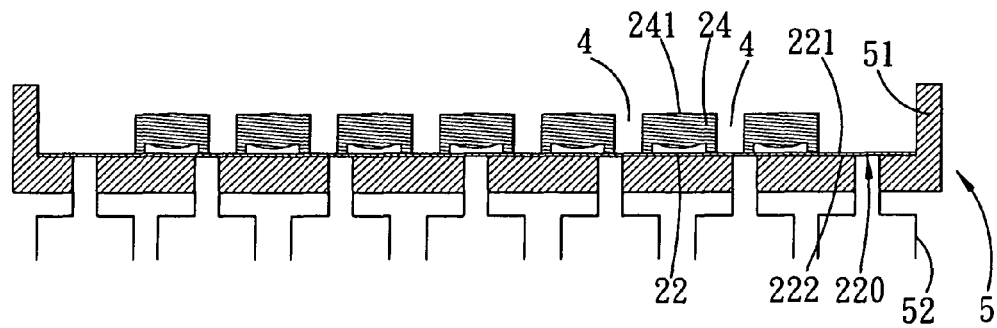
Figure 4D:
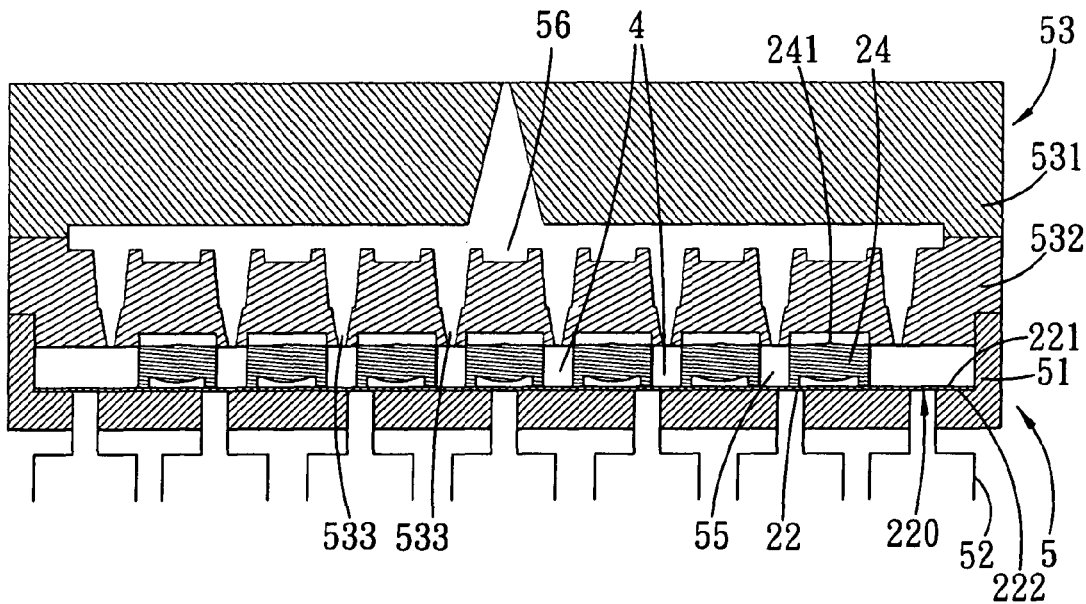

III) mounting the wafer in a mold:

Referring to FIGS. 4C and 4D, a mold 5 is provided, which includes an upper mold part 53, a lower mold part 51 cooperating with the upper mold part 53 to define a mold cavity 55, and a plurality of ejecting pins 220 opposite to the upper mold part 53 and inserted into the lower mold part 51. The wafer 220 is mounted in the lower mold part 51. The upper mold part 53 is then mounted on the lower mold part 51 so as to close the mold 5 and to receive the wafer 220 with the lens assemblies 24 in the mold cavity 55. The upper mold part 53 includes an upper mold component 531 and a lower mold component 532 cooperating with the upper mold component 531 to define a runner 56. The lower mold component 532 is provided with a plurality of openings 533 communicating with the spacing grooves 4.

Figure 4E:
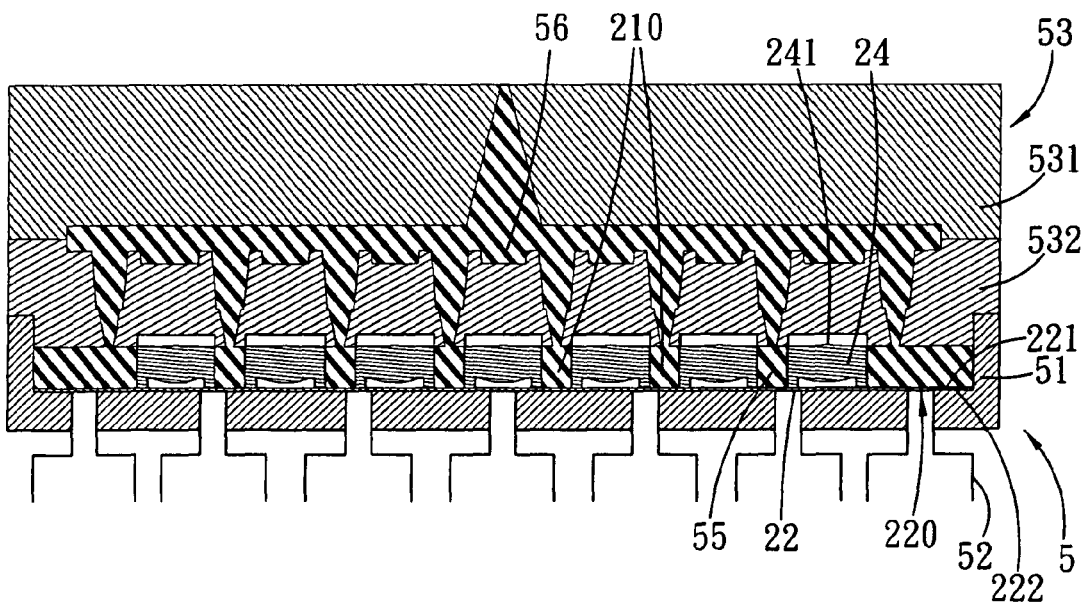

IV) filling a resin material:

Referring to FIG. 4E, a resin material is filled into the lower mold part 51 and the spacing grooves 4 through the runner 56, and the openings 533 of the lower mold component 532 of the upper mold part 53 so as to form a substrate layer 210 by insert molding. In the preferred embodiment, the resin material is filled into the lower mold part 51 and the spacing grooves 4 through a plurality of the openings 533 so as to shorten the filling period.

Figure 4F:
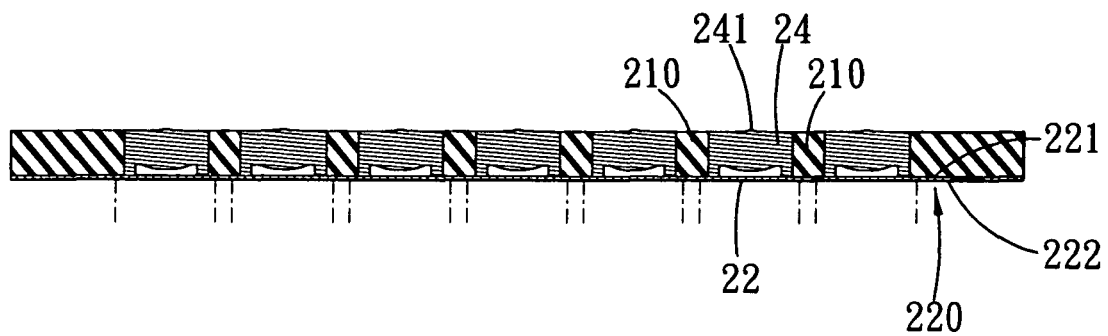

V) taking the wafer out of the mold:

Referring to FIGS. 4E and 4F, after the resin material is solidified, the upper mold part 53 is moved away from the lower mold part 51, and the ejecting pins 220 are moved upward so as to eject and take the wafer 220 out of the lower mold part 51.

Figure 4G:
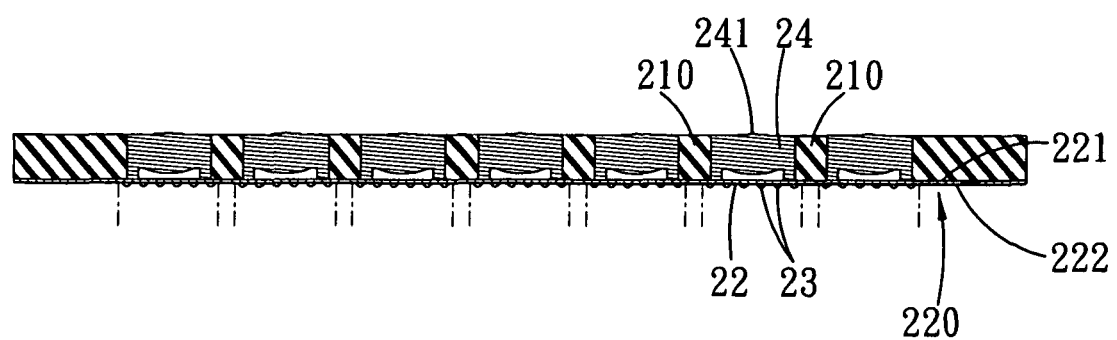

VI) mounting a plurality of conductive blocks:

Referring to FIG. 4G, a plurality of conductive blocks 23 are mounted on bonding pads (not shown) on the second surface 222 of the wafer 220 using a surface mounting technology. In the preferred embodiment, the conductive blocks 23 are solder balls. Alternatively, the conductive blocks 23 can be conductive bumps.

Figure 4H:
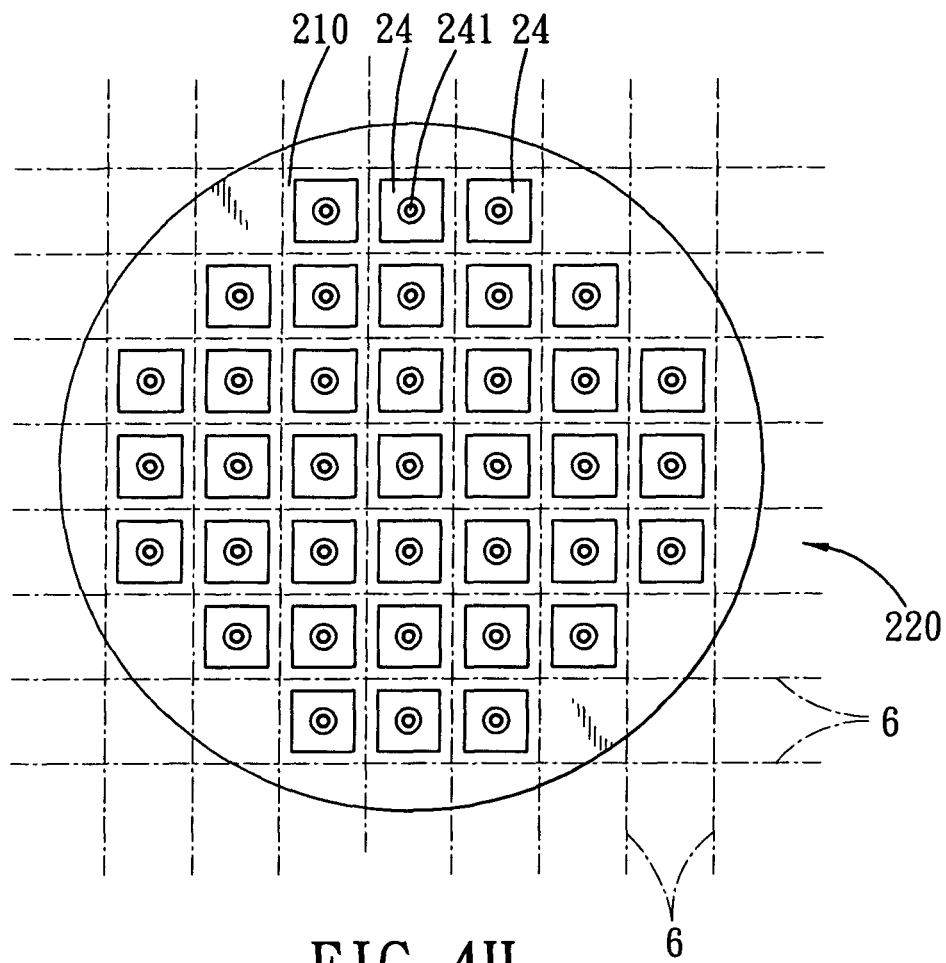

VII) cutting the wafer and the substrate layer:

Referring to FIG. 4H, the wafer 220 and the substrate layer 210 are cut along intersecting cutting lines 6 each extending along one of the spacing grooves 4 and each intervening the lens assemblies 24. The substrate layer 210 is divided into a plurality of barrels 21 (best shown in FIG. 4I) respectively surrounding the lens assemblies 24.

Figure 4I:
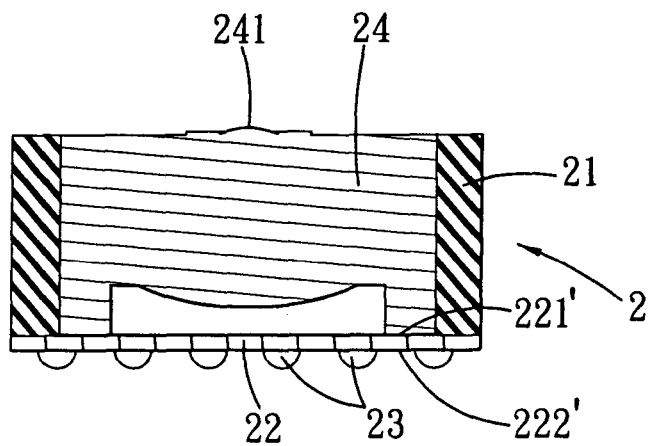

Referring to FIG. 4I, a plurality of lens modules 2 are made simultaneously by the aforesaid method. Each of the lens modules 2 made by the third preferred embodiment of the method of this invention is identical to that made by the first preferred embodiment of the method of this invention.

Referring to FIGS. 5A to 5J, the fourth preferred embodiment of a method for making lens modules according to this invention is substantially identical to the third preferred embodiment except for the following.

Figure 5A:
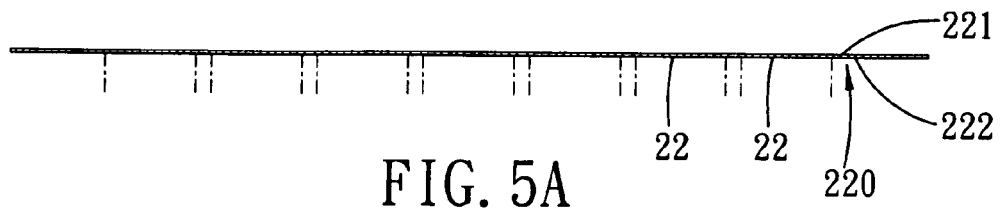
FIGS. 5A to 5J are schematic views illustrating consecutive steps of a fourth preferred embodiment of a method for making lens modules according to this invention.
Figure 5B:
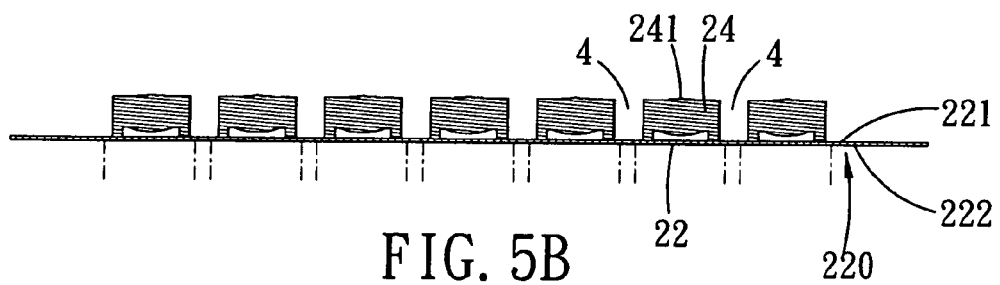
Figure 5C:
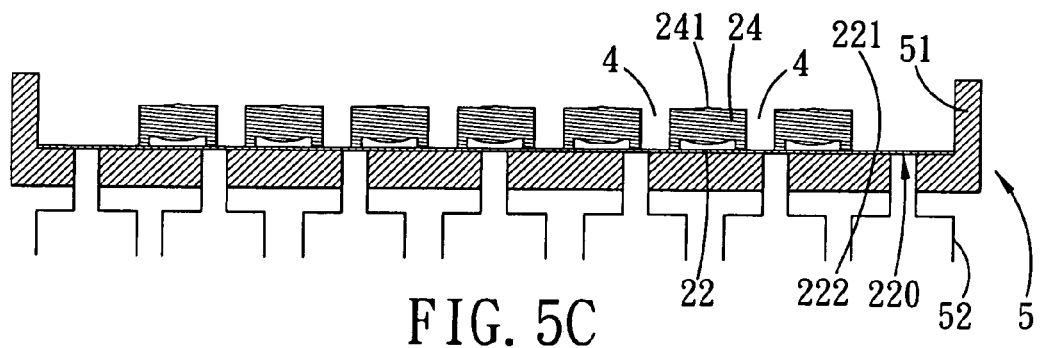
Figure 5D:
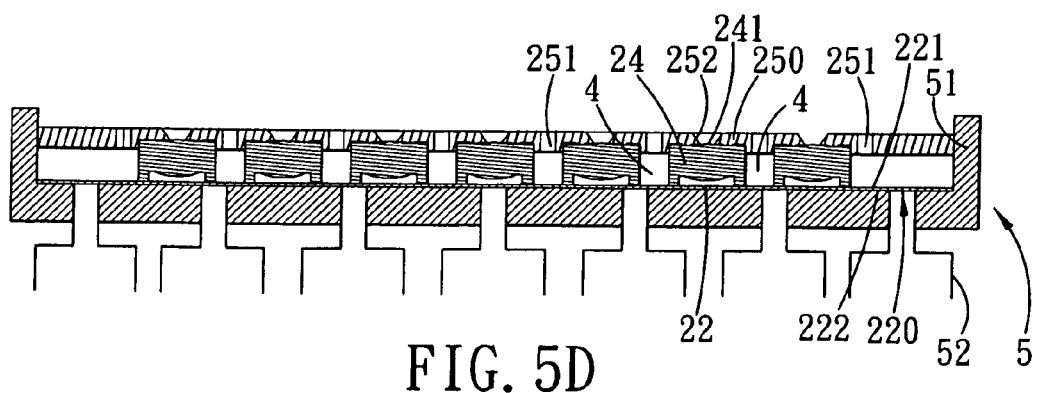

Referring to FIG. 5D, after the wafer 220 is mounted in the lower mold part 51, a cover layer 250 is mounted on the lens assemblies 24. The cover layer 250 is in the form of a thin circular plate having a diameter identical to an inner diameter of the lower mold part 51. The cover layer 250 includes a plurality of light-transmissive holes 252 corresponding to the light-transmissive portions 241 of the lens assemblies 24, and a plurality of injecting holes 251 spaced apart from each other and communicated with the spacing grooves 4.

Figure 5E:
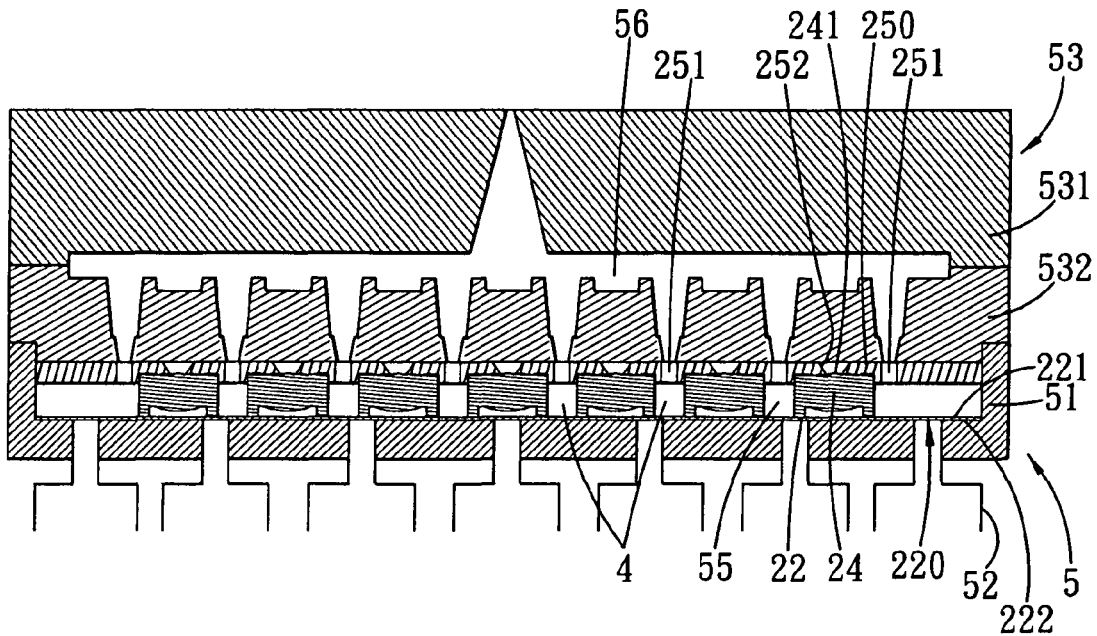
Figure 5F:
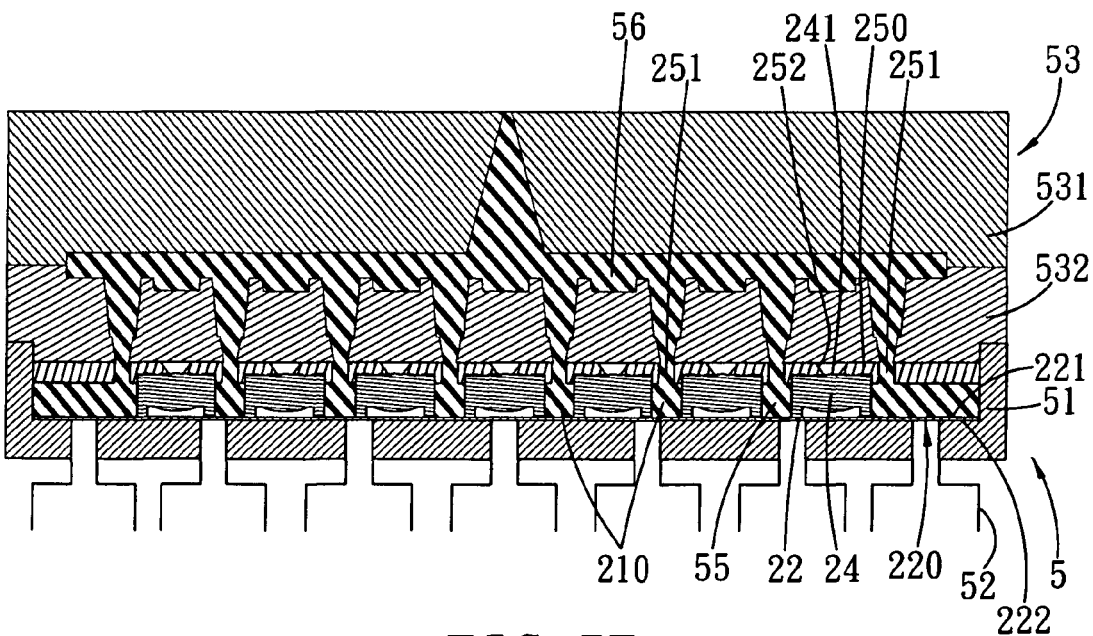
Figure 5G:
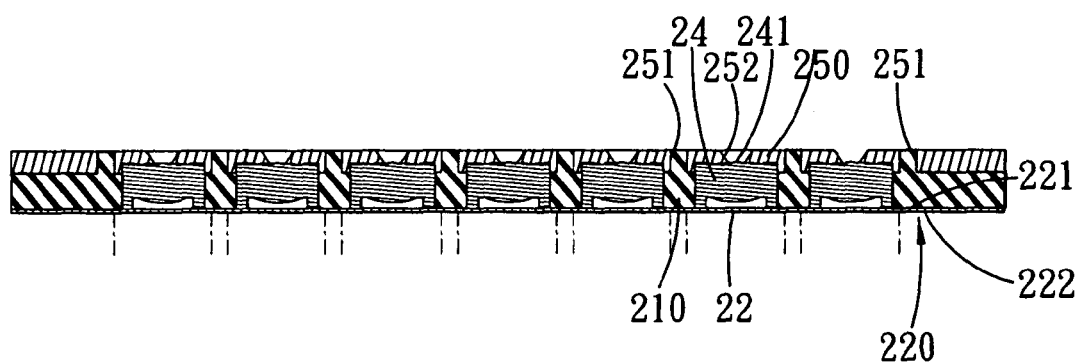
Figure 5H:
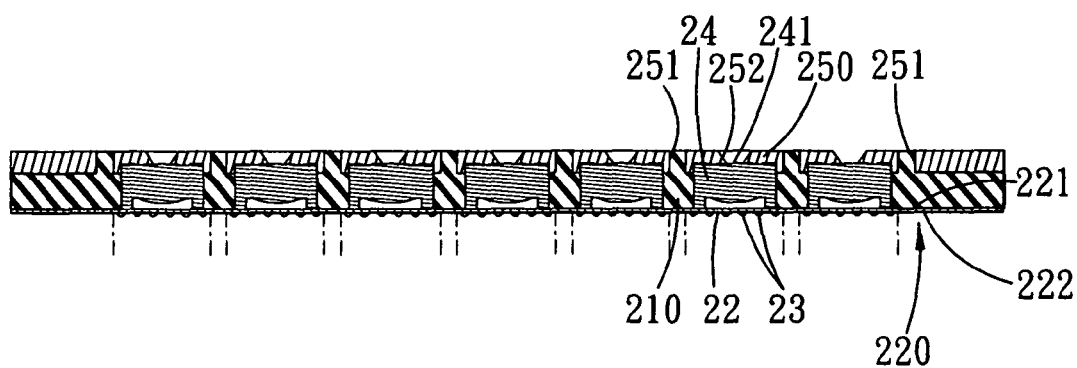
Figure 5I:
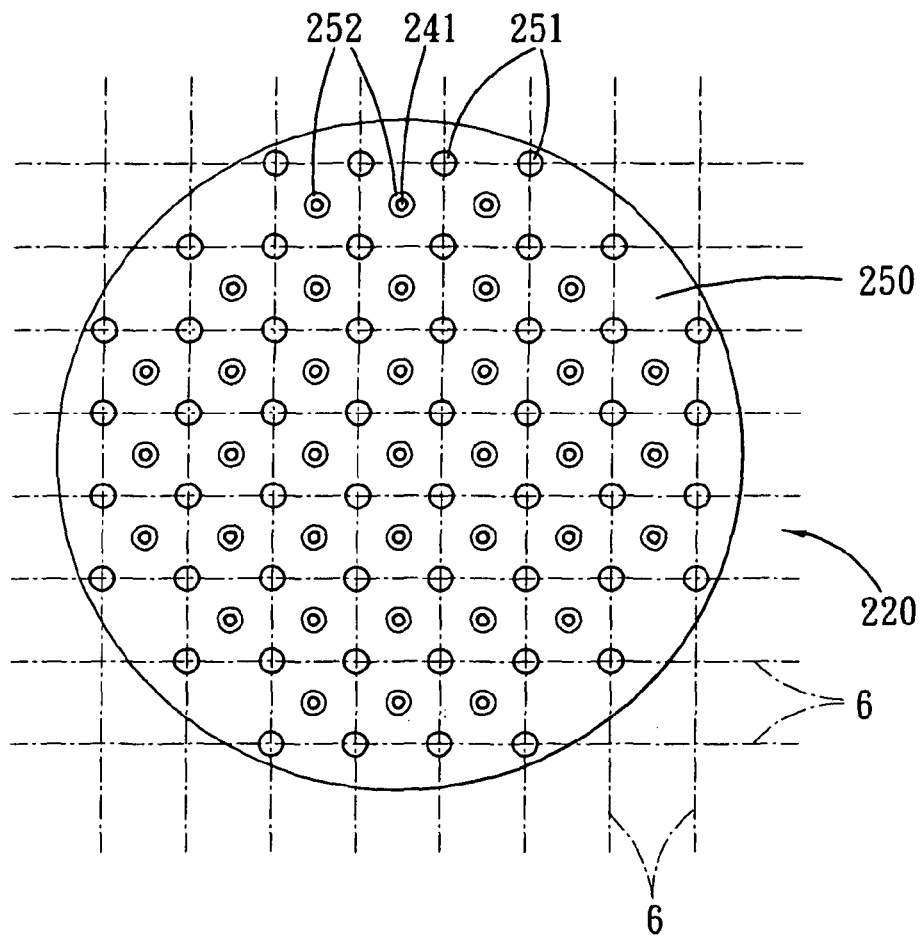

Referring to FIGS. 5E and 5F, after the mold 5 is closed, the resin material is filled into the lower mold part 51 and the spacing grooves 4 through the runner 56, the openings 533 of the lower mold component 532 of the upper mold part 53, and the injecting holes 251 of the cover layer 250 so as to form a substrate layer 210 by insert molding.

Figure 5J:
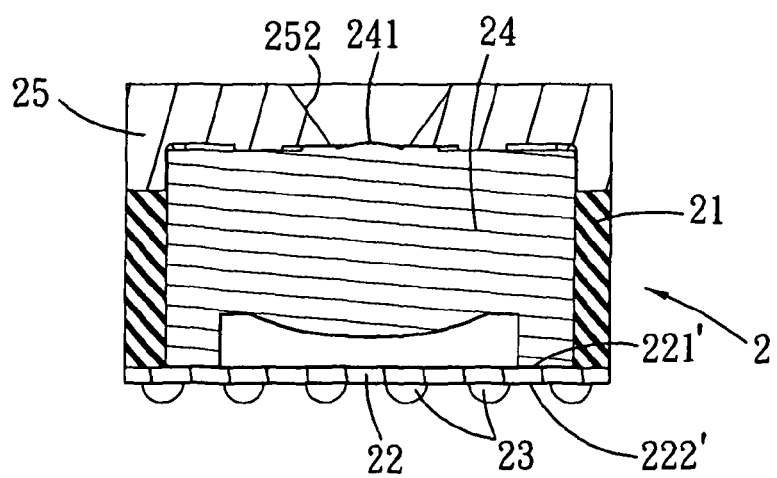

Referring to FIG. 5J, a plurality of lens modules 2 are made simultaneously by the aforesaid method. Each of the lens modules 2 made by the fourth preferred embodiment of the method of this invention is identical to that made by the second preferred embodiment of the method of this invention.

In view of the aforesaid, a plurality of lens modules 2 each having a miniaturized size can be made by the method of this invention. Therefore, the yield is increased and the production cost is reduced.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:
1. A method for making camera modules, comprising the steps of:
   a) providing a wafer including an array of sensor chips;
   b) mounting a plurality of lens assemblies on the sensor chips, respectively, thereby defining a plurality of intersecting spacing grooves among the lens assemblies;
   c) mounting a cover layer over the lens assemblies and the spacing grooves, the cover layer including a plurality of light-transmissive holes corresponding to the lens assemblies and a plurality of spaced apart injecting holes communicated with the spacing grooves;
   d) forming a substrate layer by filling in the spacing grooves with a resin material through the injecting holes; and
   e) cutting the wafer, the cover layer, and the substrate layer along intersecting cutting lines each extending along one of the spacing grooves and each intervening the lens assemblies, wherein the substrate layer is divided into a plurality of barrels respectively surrounding the lens assemblies, and the cover layer is divided into a plurality of covers each of which has one of the light-transmissive holes and each of which is disposed over one of the barrels and one of the lens assemblies.

2. The method as claimed in claim 1, further comprising mounting a surrounding wall on the wafer before the step d), the surrounding wall extending along the periphery of the wafer and surrounding the lens assemblies and the spacing grooves, wherein the resin material is injected into the surrounding wall and the spacing grooves in the step d).

3. The method as claimed in claim 1, wherein the step d) is conducted by insert molding.

4. The method as claimed in claim 1, further comprising a step of mounting a plurality of conductive blocks on the wafer opposite to the lens assemblies.

* * * * *